US005392010A

United States Patent [19]

Nakahara

[11] Patent Number: 5,392,010

[45] Date of Patent: Feb. 21, 1995

[54] 90 DEGREE PHASE SHIFTER

[75] Inventor: Kazuhiko Nakahara, Itami, Japan

[73] Assignee: Mitsubishi Denki Kabushiki Kaisha, Tokyo, Japan

[21] Appl. No.: 158,772

[22] Filed: Dec. 1, 1993

[30] Foreign Application Priority Data

Apr. 21, 1993 [JP] Japan .................................. 5-093474

[51] Int. Cl.[6] .......................... H01P 1/18; H03H 7/18

[52] U.S. Cl. .................................... 333/161; 333/164

[58] Field of Search ............... 333/103, 104, 138, 140, 333/156, 161, 164

[56] References Cited

U.S. PATENT DOCUMENTS

| | | | |
|---|---|---|---|
| 4,612,520 | 9/1986 | Boire et al. | 333/161 X |
| 5,028,892 | 7/1991 | Daughters | 333/138 X |

FOREIGN PATENT DOCUMENTS

| | | | |
|---|---|---|---|
| 409374 | 3/1990 | European Pat. Off. . | |
| 123201 | 5/1988 | Japan | 333/161 |
| 123202 | 5/1988 | Japan | 333/161 |
| 349401 | 3/1991 | Japan . | |
| 1515222 | 10/1989 | U.S.S.R. | 333/161 |

OTHER PUBLICATIONS

Robert V. Garver, "Broad-Band Diode Phase Shifters," IEEE Transactions on Microwave Theory and Techniques, vol. 20, No. 5, May 1972, New York, pp. 314–323.

Takatoshi et al, "L-Band Shifter with Switching FET's for Phased Array Antenna," IEEE International Microwave Symposium Digest Jun. 1-5, 1992, Albuquerque, Digest, vol. 3, New York, 1992 pp. 1527-1530.

Liang et al, "High-Temperature Superconductor Resonators and Phase Shifters," IEEE Transactions on Applied Superconductivity, vol. 1, No. 1, Mar. 1991, New York, pp. 58-66.

*Primary Examiner*—Seungsook Ham

*Attorney, Agent, or Firm*—Leydig, Voit & Mayer

[57] ABSTRACT

A switched line type 90° phase shifter includes two single pole double throw switches, a reference transmission line having an electrical length of $\alpha$ connected between output terminals of the first and the second single pole double throw switches, a phase difference producing transmission line having an electrical length of $(90°+\alpha)$ at a usage frequency, connected between other output terminals of the first and the second single pole double throw switches, and a phase inverting circuit switchablely connected for serial connection to and between two parts of the reference transmission line, which two parts produce the entirety of the reference transmission line, the one terminal of the first single pole double throw switch is an input terminal of the entire terminal and one terminal of the second single pole double throw switch is an output terminal.

5 Claims, 11 Drawing Sheets

90 DEGREE PHASE SHIFTER

FIELD OF THE INVENTION

The present invention relates to a 90° phase shifter and, more particularly, to a switched line type phase shifter.

BACKGROUND OF THE INVENTION

FIG. 8 is a circuit diagram of a conventional switched line type phase shifter. In the figure, reference numeral 1 designates an input terminal and reference numeral 2 designates an output terminal. Four field effect transistors 3 are provided at two paths from the input terminal 1 or at the two paths to the output terminal 2 (hereinafter referred to as "FET"). Reference numeral 4 designates resonance lines connected between source and drain electrodes of the FETs 3, respectively, as resonance inductances, respectively. Reference numeral 5 designates gate bias terminals of respective FETs 3. A reference line 6 having a predetermined electrical length $\alpha$ is provided between the other end of one of the input side FETs 3 and the other end of one of the output side FETs 3. A phase difference producing line 7 having an electrical length $(\alpha+\beta)$ which is longer than that of the reference line 6 by a desired electrical length $\beta$ is provided between the other end of the other one of the input side FETs 3 and the other end of the other one of the output side FETs 3.

Description is given of the operation.

This switched line type phase shifter includes by two single pole double throw switches 50 and 51 which receive signals at the input terminals 1 and 2 and output signals to either of the two output terminals 40*a* and 40*b*, 41*a* and 41*b*, and two transmission lines 6 and 7 connected between respective output terminals of the one or the other of the two switches, that have electrical length $\alpha$, $(\alpha+\beta)$, respectively. Therefore, by switching the path for the input signal which is input to the input terminal 1 of this phase shifter between that transmitted on the reference line 6 having an electrical length $\alpha$ to reach the output terminal 2 of this phase shifter, or that transmitted on the transmission line 7 having an electrical length $(\alpha+\beta)$ which is longer by a desired electrical length $\beta$ than the reference line 6, a phase difference $\beta$ in the electrical length is obtained.

In other words, the switched line type phase shifter shown in FIG. 8 performs a switching operation of the resonance circuit comprising the FETs 3 and the resonance lines 4. When the gate bias voltage of the FETs 3 is set at zero volts, the path between the source and drain electrodes is equivalent to a low resistance of below several Ω, meaning an on-state. When the gate bias voltage of the FET 3 is set below the pinch-off voltage, the path between the source and drain electrodes is equivalent to a parallel circuit comprising a resistance of several kΩ and a capacitance at off-state ($C_T$), and having a resonance determined by the off-state capacitance ($C_T$) and the resonance line 4 connected between the source and the drain of the FET, i.e., an off-state. Even in this off-state, however, it is actually impossible to realize an ideal off-state. Accordingly, a leakage signal is transmitted through the line of the off-state side, and as a result, a signal which is output to the output terminal of the phase shifter is the vector synthesis of the signal transmitted in the on-state line and the leakage signal transmitted in the off-state line. FIG. 9 shows a diagram of this vector synthesization.

In FIG. 9, reference numeral 8 represents a signal vector of a signal transmitted on the reference signal 6. Reference numeral 9 represents a signal vector of a leakage signal transmitted on the line 7. Reference numeral 10 designates a vector obtained by synthesizing the vectors 8 and 9. Reference numeral 11 represents a signal vector of a signal transmitted on the reference line 6. Reference numeral 12 represents a signal vector of a signal transmitted on the line 7. Reference numeral 13 designates a vector obtained by synthesizing the both vectors 8 and 9. In this example, the vector 9 is in an advanced phase relative to the vector 8, the vector 12 is in a retarded phase relative to the vector 11, and the synthesized vector 13 is in an advanced phase by about 90° relative to the synthesized vector 10, presenting this phase difference as the phase shift of this phase shifter.

In this way, in this microwave phase shifter, while the vector 9 is in an advanced phase relative to the vector 8, the vector 12 is in a retarded phase relative to the vector 11, and the electrical length $\beta$ by which the electrical length $(\alpha+\beta)$ of the line 7 is longer than the line 6 is set to a value larger than 90° so that the synthesized vector 13 is at 90° in reverse phase relative to the synthesized vector 10.

In the switched line type phase shifter of such a construction, the amplitudes of the vectors 9 and 12 vary dependent on the variation in the amplitude of the leakage signal of the FET in the off-state and the amplitudes of the vectors 10 and 13 also vary, thereby deviating the angle produced by the synthesized vectors from 90°. Therefore, it is necessary to know the amplitude of the leakage signal in the off-state FET before designing the phase shifter, and it is necessary to adjust the phase shifting by that amount. In this phase shifter, however, when the two FETs located adjacent to each other have the same leakage and the values are not coincident with the design values, the phase shift amount cannot be made 90°, and when the off-capacitances FET ($C_T$) vary between adjacent FETs depending on the non-uniformity of the production process, the amplitude of the leakage signal also varies, thereby varying the phase shift quantity from 90°.

The prior art switched line type phase shifter is constituted as described above, and when the off-time capacitance varies dependent on variations in processing, the quantity of signal leaking on the off-side line varies, whereby the synthesized vectors 10 and 13 shown in FIG. 9 vary, resulting in a deviation in the phase shift amount.

SUMMARY OF THE INVENTION

It is an object of the present invention to provide a switched line type 90° phase shifter that requires no consideration of by leakages through a resonance circuit.

It is another object of the present invention to provide a 90° phase shifter that can prevent phase shift variations by canceling variations in leakages through a resonance circuit.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from the detailed description.

According to a first aspect of the present invention, a switched line type 90° phase shifter includes two single pole double throw switches which receive an input signal input to an input terminal and output the signal to either of two output terminals, or receive two signals respectively input to the two output terminals and output either of the two input signals to the input terminal, a reference transmission line having an electrical length $\alpha$ at the usage frequency, connected between terminals of the first and second single pole double throw switches, a phase difference producing transmission line having an electrical length of $(90°+\alpha)$ at the usage frequency being connected between two terminals of the first and the second single pole double throw switches, a phase inverting circuit provided switchably between a state of being inserted serially between two parts of the reference transmission line, which two parts produce the entirety of the reference transmission line, and one of the terminals of the first single pole double throw switch being an input terminal of the entire circuit, and one of the terminals of the second single pole double throw switch being an output terminal.

According to a second aspect of the present invention, a 90° phase shifter includes a phase inverting circuit comprising a resonance circuit including a switch comprising an FET and a resonance line, inserted between two parts of the reference transmission line at a position of one-half of the entire electrical length of the reference transmission line, and a half-wavelength transmission line of electrical length of 180° connected in parallel with the resonance circuit.

According to a third aspect of the present invention, the above-described phase inverting circuit is a reflector type 180° phase shifter.

According to a fourth aspect of the present invention, the above-described reflector type 180° phase shifter is a 3 dB directional coupler using a Lange coupler.

According to a fifth aspect of the present invention, the above-described reflector type 180° phase shifter is a branch line type 3 dB directional coupler.

According to the present invention, the leakage signal on a second line is in an advanced phase relative to the main signal flowing on the main line and the obtained phase shift amount surely becomes 90°. Therefore, influences on the phase shift by the leakages at the off-state of the resonance circuit are eliminated.

DETAILED DESCRIPTION OF THE PREFERRED EMBODIMENTS

EMBODIMENT 1

Figure 1:
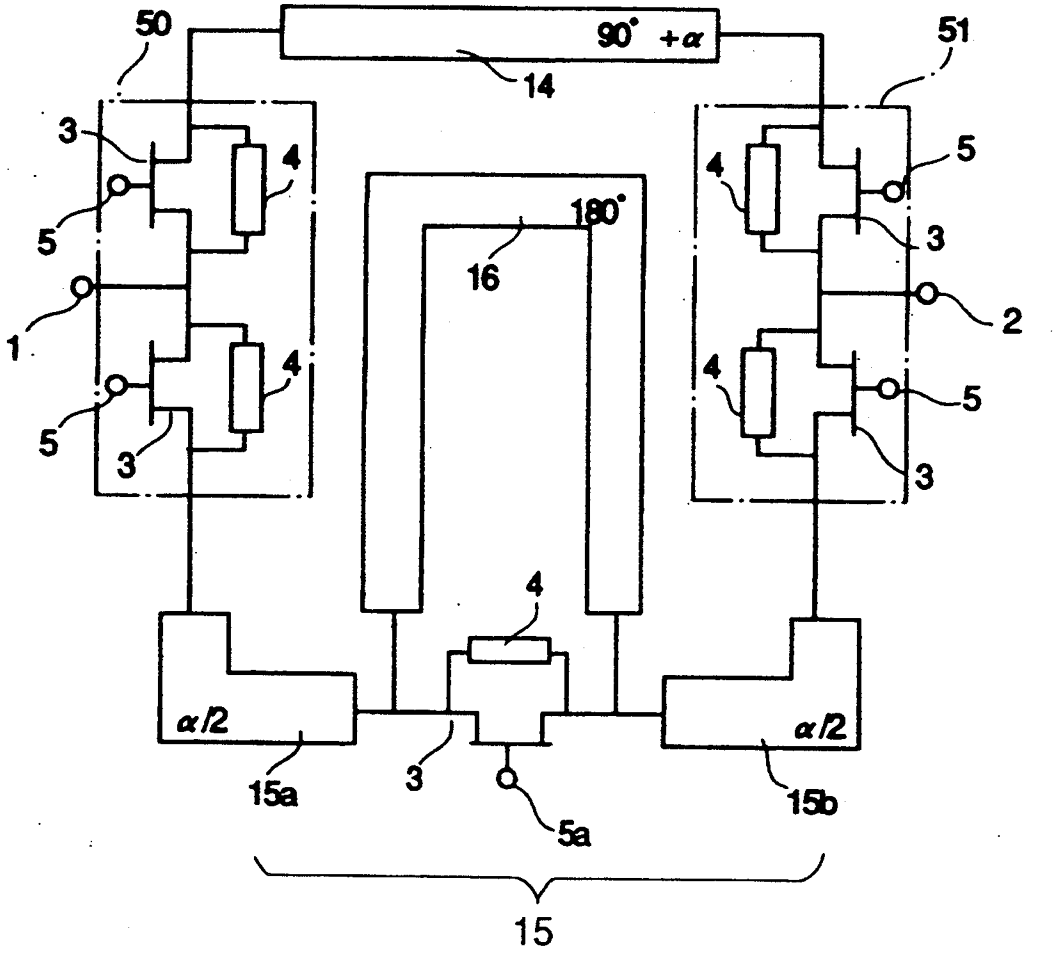
FIG. 1 is a diagram illustrating a circuit construction of a 90° phase shifter according to a first embodiment of the present invention.
Figure 8:
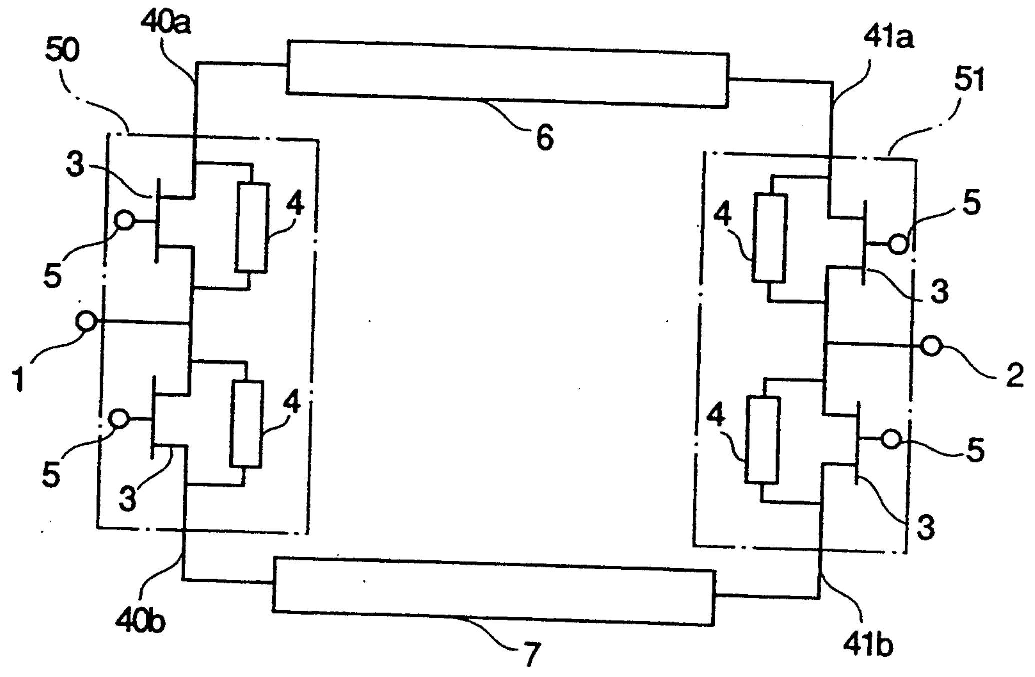
Fig.8 (Prior Art)
FIG. 8 is a diagram illustrating a circuit construction of a prior art 90° phase shifter.
Figure 9:
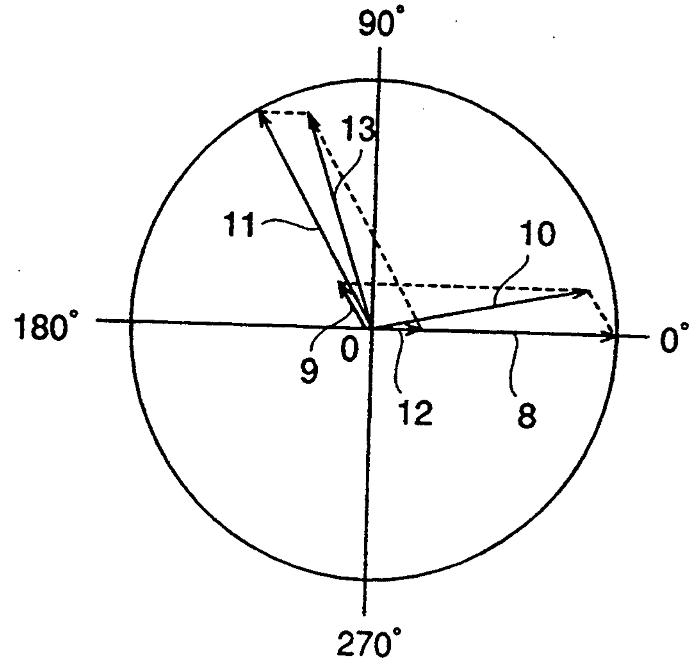
Fig.9 (Prior Art)
FIG. 9 is a vector diagram illustrating an operating state of the prior art 90° phase shifter.

FIG. 1 is a diagram illustrating a 90° phase shifter according to a first embodiment of the present invention. In the figure, the same reference numerals as those shown in FIG. 8 designate the same or corresponding elements. Reference numeral 14 designates a 90° phase shifting transmission line having an electrical length of $(\alpha+90°)$ as a sum of the electrical length $\alpha$ of the reference line and the electrical length 90° at the use frequency. Reference numerals 15*a* and 15*b* designate one half reference lines each having an electrical length of $\alpha/2$ which is equal to one half of the electrical length $\alpha$ of the reference line described in the 90° phase shift line 14. Together lines 15*a* and 15*b* are a reference transmission line 15 of electrical length $\alpha$. As in FIG. 8, reference numerals 3 and 4 respectively designate FET switches and a resonance inductance lines which are provided between the two one half reference lines 15*a* and 15*b* and connected in parallel with each other as a parallel resonance circuit. A transmission line 16 of an electrical length of 180° as a phase inverting circuit, is provided in parallel with the parallel resonance circuit comprising the FET switches 3 and the resonance lines 4.

Figure 10:
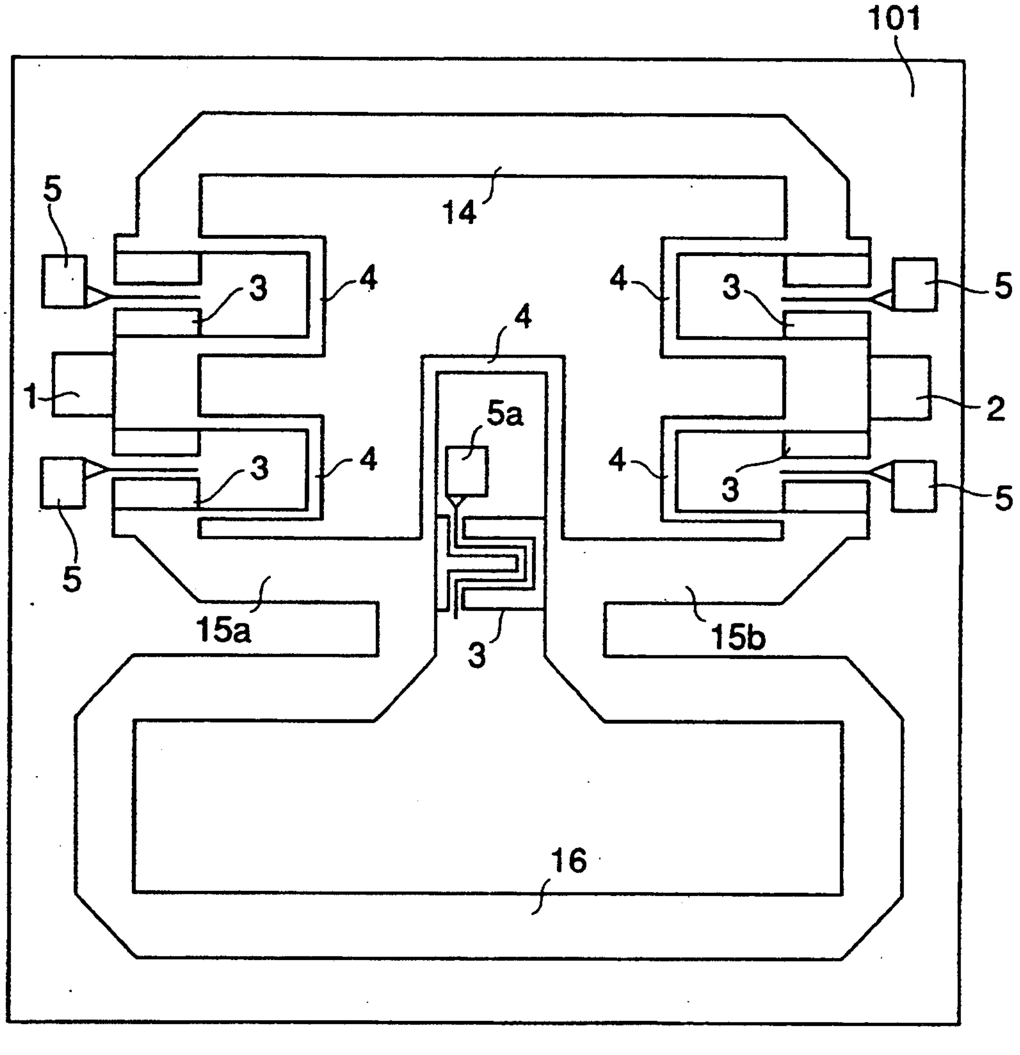
FIG. 10 is a diagram illustrating a circuit pattern of a 90° phase shifter according to a first embodiment of the present invention.

FIG. 10 shows a layout diagram of the 90° phase shifter of this first embodiment. In FIG. 10, the same reference numerals are used to represent those described above and the circuit patterns of this 90° phase shifter are produced on a substrate 101.

The fundamental operation of the 90° phase shifter of this first embodiment is approximately the same as that of the prior art phase shifter, although the signal leaked from the off-state FET in the prior art switched line type phase shifter is inverted in its phase by the phase inverting circuit 16.

Figure 2:
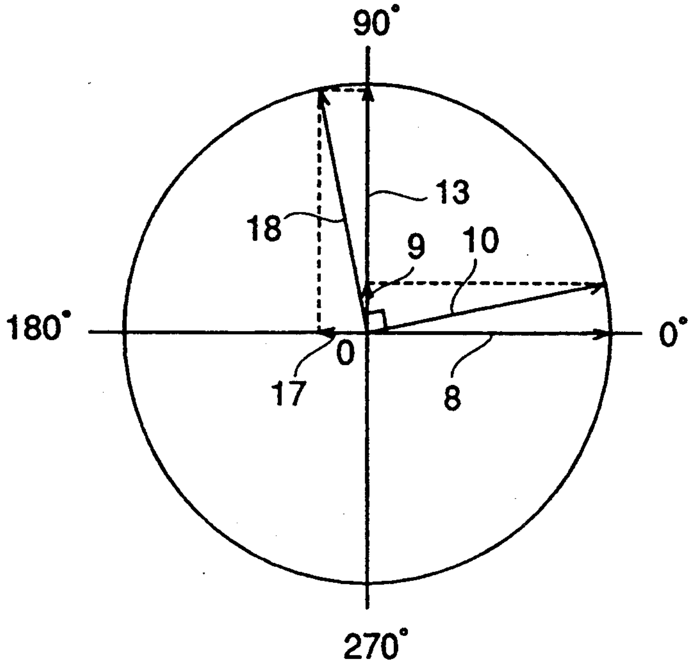
FIG. 2 is a vector diagram illustrating an operating state of a 90° phase shifter according to the first embodiment of the present invention.

FIG. 2 shows a vector diagram illustrating an operation state of this 90° phase shifter. A description is given of the operation with reference to this FIG. 2.

First of all, the side of the reference lines 15*a* and 15*b* where the phase inverting circuit 16 is connected is turned on, so the phase inverting circuit 16 is short circuited, i.e., turned off, thereby the phase shifter is in a state not inverting the phase, while the side of the line 14 for shifting the signal by 90° is turned off i.e., disconnected. Then, the signal passing through the reference line 15 is represented by the signal vector 8 in FIG. 2, and the leakage signal passing through the 90° phase shifting line 14 is represented by the signal vector 9. Therefore, the output signal represented by the signal vector 10 obtained by the vector synthesization of the vectors 8 and 9 is output.

Thereafter, the FET switch 3 at the reference line 15 provided with the phase inverting circuit 16 is turned off, so the phase inverting circuit 16 is effective, whereby the phase shifter enters a phase inverting state, when the 90° phase shifting line 14 is turned on, i.e., connected. Then, the signal passing on the line 14 is represented by the signal vector 13, and the signal passing on the line 15 and the phase inverting circuit 16 is represented by the signal vector 17. Therefore, the output signal represented by the signal vector 18 obtained by the vector synthesization of the vectors 13 and 17 is output.

By performing such an operation, the signal leaking on the off side line becomes 90° phase advanced signals 9 and 17 relative to the on side line signals 8 and 13 in both cases, and because the difference in the electrical length between the lines 14 and 15 is set to an electrical length generating a phase difference of 90°, the vector 10 and the vector 18 always realize a phase difference of 90° therebetween. In addition, if the characteristics of the FETs 3 which are produced adjacent each other are the same, even when the off-capacitance $C_T$ of the FET varies depending on the non-uniformity of processing, the vectors 9 and 17 vary by the same amount at the same time, and the phase difference between the vector 10 and the vector 18 is always kept at 90°, thereby providing a 90° phase shifter with stable operation.

The 90° phase shifter of this first embodiment includes a switched line type 90° phase shifter such that a phase inverting circuit 16 is switched between a state where the phase inverting circuit is inserted in series between two parts of the reference line and a state where it is not inserted, that is added to a construction where the difference in the electrical length between the reference lines 15*a* and 15*b* and the phase difference producing line 14 is 90°, and thereby the leakage signal flowing on the reference line or the phase difference producing line when the resonance circuit is in off-state reliably has an advanced phase by 90° relative to the signal of the on side line. Accordingly, the influence on the phase shift amount due to the leakage signal becomes the same in both cases where the leakage signals are generated in any of the two lines, and the phase shifter cancels the influences of this leakage signal in its operation. Therefore, so far as the leakage signal of the FETs adjacent each other are the same, it is neither required to know the amplitude of the leakage signal nor to consider the same before designing the phase shifter, thereby simplifying circuit design as well as improving the precision of the circuit design to a great extent. Furthermore, non-uniformities due to processing can be tolerated, thereby accomplishing a high yield.

EMBODIMENT 2

Figure 3:
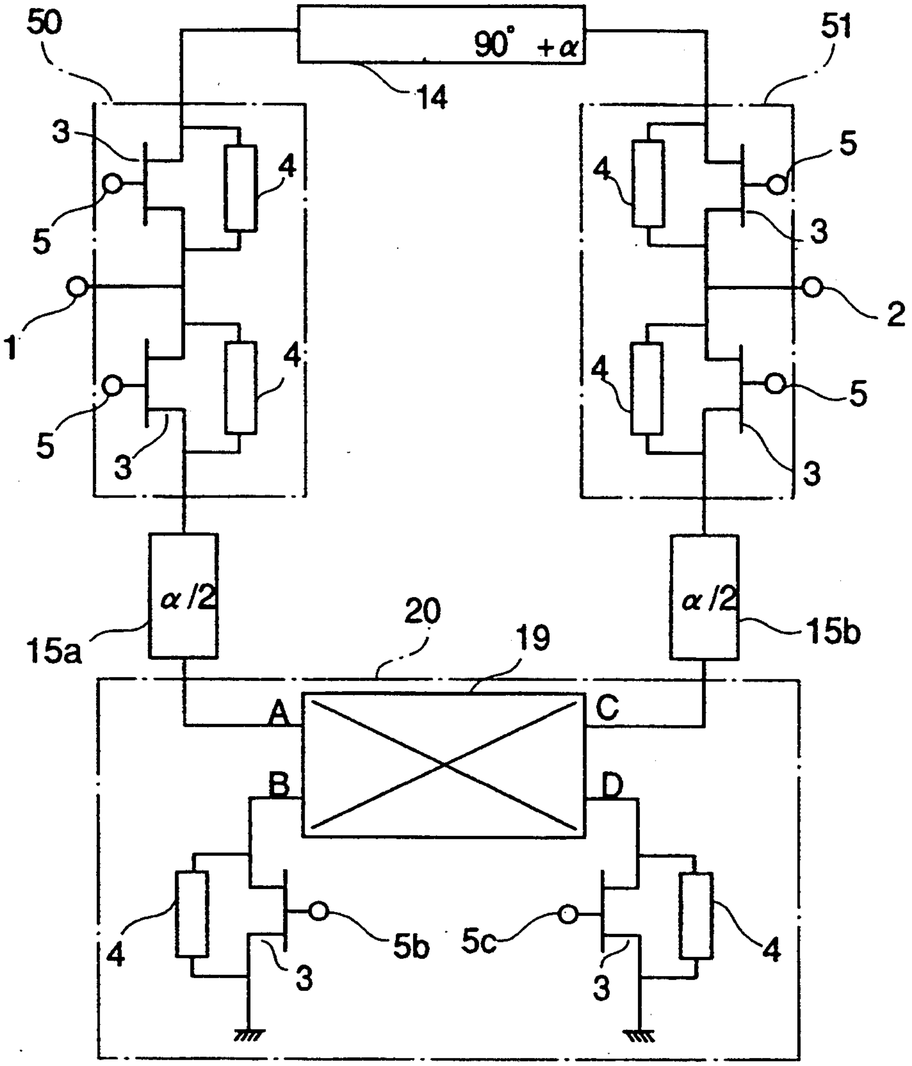
FIG. 3 is a diagram illustrating a circuit construction of a 90° phase shifter according to a second embodiment of the present invention.

FIG. 3 is a diagram illustrating a 90° phase shifter according to a second embodiment of the present invention.

In the first embodiment the phase inverting circuit is a 180° line 16 connected in parallel with the resonance circuit comprising the FETs 3 and the resonance lines 4, but in this second embodiment the phase inverting circuit is a 180° reflector type phase shifter 20.

Figure 11:
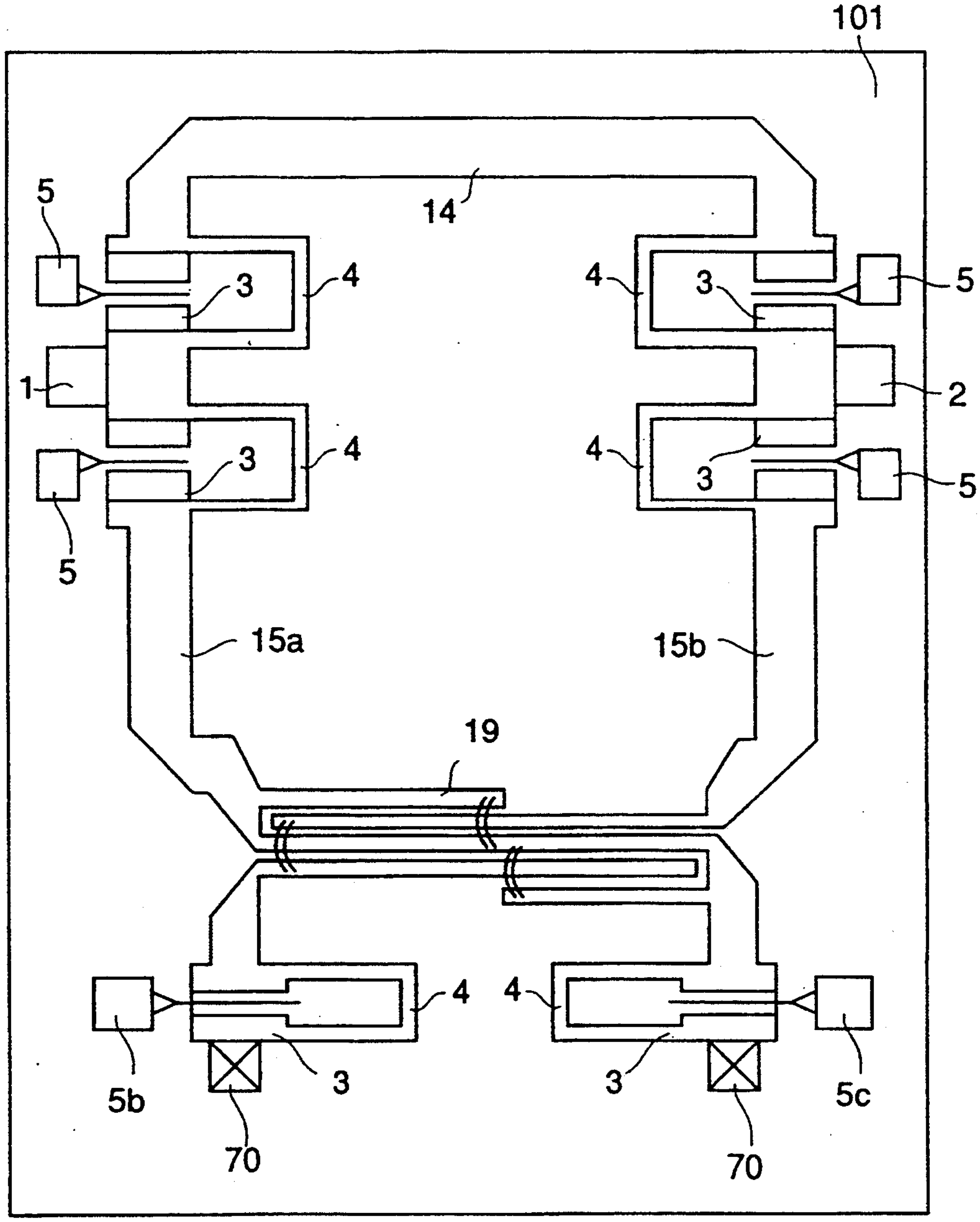
FIG. 11 is a diagram illustrating a circuit pattern of a 90° phase shifter according to a second embodiment of the present invention.

FIG. 11 shows a pattern layout of this second embodiment. In FIG. 11, reference numeral 19 designates a 3 dB directional coupler using a Lange coupler, a 180° reflector type phase shifter 20 with two switches each comprising an FET 3 and a resonance line 4.

Reference numeral 70 designates a ground pad and reference numeral 102 designates a substrate.

Figure 4:
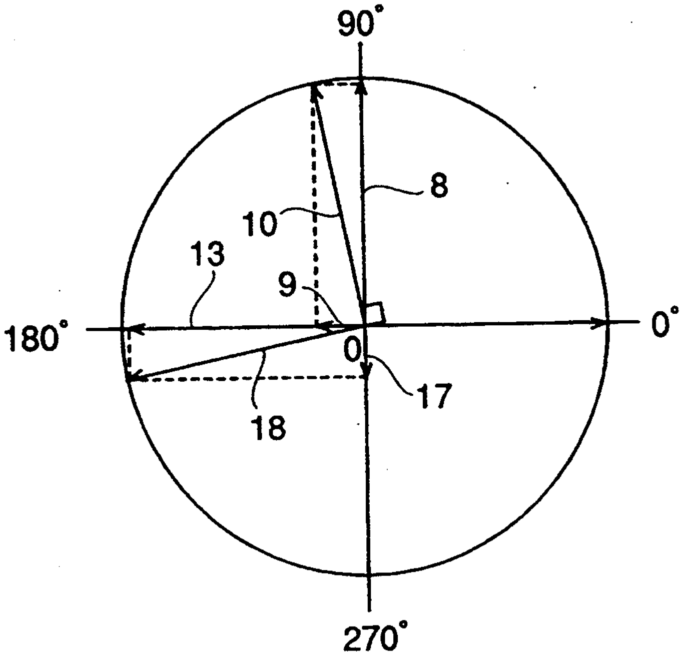
FIG. 4 is a vector diagram illustrating an operating state of the 90° phase shifter according to the second embodiment of the present invention.

FIG. 4 is a vector diagram showing an operation state of the 90° phase shifter of this second embodiment, and a description is given of the operation of 90° phase shifter of this second embodiment with reference to FIG. 4.

First of all, the reference line 15 comprising reference line parts 15*a* and 15*b* provided with the 180° reflector type phase shifter 19 is turned on, the reflector type phase shifter 19 is turned off, i.e., it is set to a state where the phase inversion is not performed, and the 90° phase shifting line 14 is turned off i.e., disconnected. Then, the signal on line 15 is represented by the signal vector 8, and the signal on the line 14 is represented by the signal vector 9. Therefore, the output signal represented by the signal vector 10 obtained by the synthesization of the vectors 8 and 9 is output.

Next, the line 15 provided with the reflector type phase shifter 19 is turned off, the reflector type phase shifter 19 is turned on, i.e., it is set to a state where the phase inversion is performed, and the 90° phase shifting line 14 is turned on i.e., connected. Then, the signal on line 14 is represented by the signal vector 13 and the signal on the line 15 is represented by the signal vector 17. Therefore, the output signal represented by the signal vector 18 obtained by the synthesization of the vectors 13 and 17 is obtained.

By performing such an operation, the leaked signal on the off side line is in an advanced phase by 90° in all cases relative to the signal of the on side line, and further, since the lines 14 and 15 are produced having electrical lengths generating a phase difference of 90°, the vector 10 and the vector 18 always have a phase difference of 90°. In addition, even when the off-capacitance $C_T$, of the FET is changed because of non-uniformities in the production process, if the FETs 3 adjacent each other have the same characteristics, the vectors 9 and 17 vary by the same amount at the same time, and the phase difference between the vector 10 and the vector 18 which are to be synthesized is always kept at 90°, thereby providing a 90° phase shifter with stable operation.

EMBODIMENT 3

A third embodiment of the present invention includes a 3 dB directional coupler functioning as the 180° reflector type phase shifter 20 in the above described second embodiment.

Figure 5:
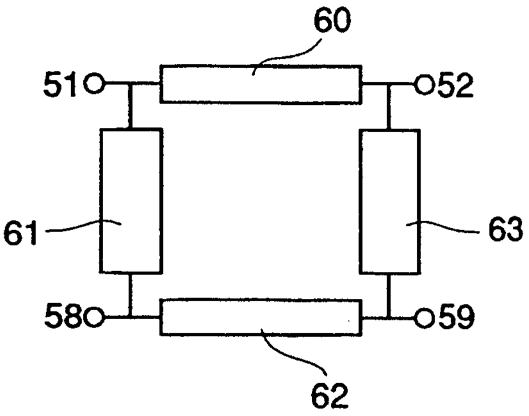
FIG. 5(*a*) is a diagram illustrating an equivalent circuit of a branch line type 3 dB directional coupler used as a 180° reflector type phase shifter 20 in the 90° phase shifter according to the third embodiment of the present invention and FIG. 5(*b*) is a diagram illustrating an equivalent circuit of the branch line type 3 dB directional coupler in a state where the load terminals 58 and 59 are grounded, FIG. 5(*c*) is a diagram illustrating an equivalent circuit of FIG. 5(*b*), FIG. 5(*d*) is a diagram illustrating an equivalent circuit of the branch line type 3 dB directional coupler in a state where the load terminals 58 and 59 are opened, and FIG. 5(*e*) is a diagram illustrating an equivalent circuit of FIG. 5(*d*).
Figure 5:
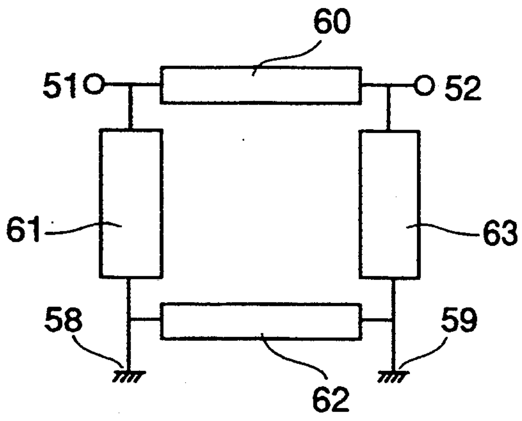
Figure 5:
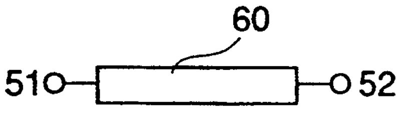
Figure 5:
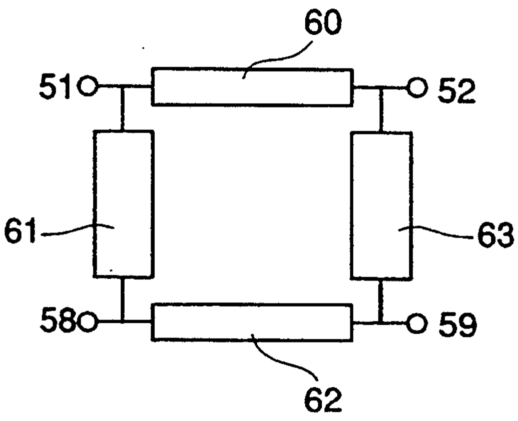
Figure 5:
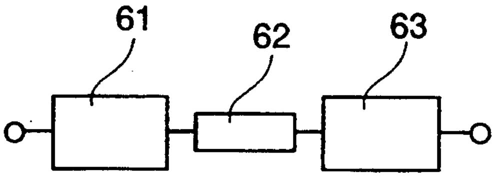

(1) Description of a branch line type 3 dB directional coupler:

FIG. 5(*a*) shows an equivalent circuit of a branch line type 3 dB directional coupler. The transmission lines 60 to 63 shown in FIGS. 5(*a*)–5(*e*) all have an electrical length of 90°. Further, the characteristic impedance of the transmission lines 60 and 62 are $Z_0$, and those of the transmission lines 61 and 63 are $Z_0/2$. In addition, reference numeral 51 designates an input terminal, reference numeral 52 designates an output terminal, and reference numerals 58 and 59 designate load terminals.

FIG. 5(*b*) shows an equivalent circuit of a branch line type 3 dB directional coupler in which load terminals 58 and 59 are grounded. Since the load terminals 58 and 59 are grounded, it is thought to be equivalent to a circuit where the transmission line 62 is absent. Since the electrical lengths of respective transmission lines are 90°, the load terminal 58 is grounded for the transmission line 61, and the impedance viewed from the input terminal 51 toward the transmission line 61 is infinite. Similarly, for the transmission line 63, the impedance viewed from the output terminal 52 is infinite. Accordingly, the equivalent circuit of FIG. 5(*b*) is represented by an equivalent circuit of FIG. 5(*c*).

FIG. 5(*d*) shows an equivalent circuit of a branch line type 3 dB directional coupler in which load terminals 58 and 59 are open. Since the load terminals 58 and 59 are open, the impedance viewed from the input terminal 51 toward the transmission line 61 is zero, i.e., meaning a short-circuited state. Similarly, the impedance viewed from the output terminal 52 toward the transmission line 63 is zero. On the contrary, for the transmission line 60, the impedances viewed from the input terminal 51 and the output terminal 52 are both infinite, and it is thought to be equivalent to a circuit where the transmission line 60 is absent. Accordingly, the equivalent circuit of FIG. 5(*d*) is represented by an equivalent circuit of FIG. 5(*e*).

Since the electrical lengths of respective transmission circuits are 90°, the difference in the electrical lengths in the equivalent circuits of FIG. 5(*c*) and FIG. 5(*e*) are 180°, thereby constituting a reflector type phase shifter 20 of FIG. 3.

Figure 6:
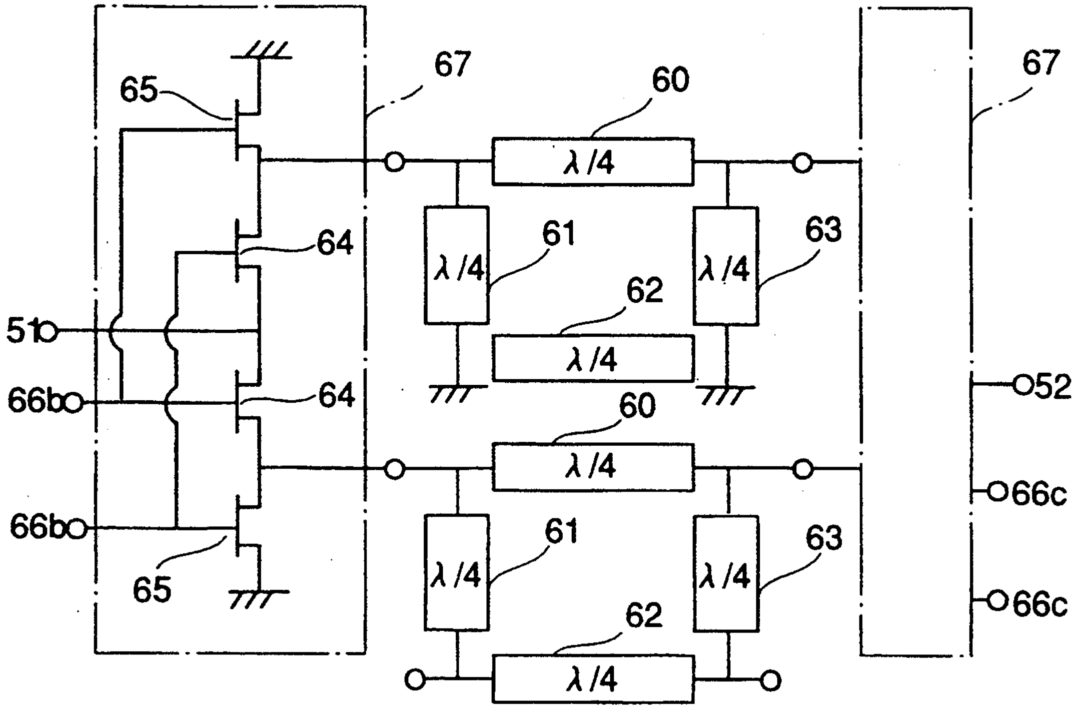
FIG. 6 is a diagram illustrating an equivalent circuit of the 180° reflector type phase shifter of a branch line 3 dB directional coupler in a 90° phase shifter according to the third embodiment of the present invention.

(2) Description of a reflector type phase shifter 20 in the 90° phase shifter of the third embodiment:

FIG. 6 shows an equivalent circuit of the reflector type phase shifter employing a branch line 3 dB directional coupler 19. In FIG. 6, reference numeral 64 designates FETs which are connected in series in the signal transmission path between the signal input terminal 51 and the signal output terminal 52. FETs 65 are connected in parallel with the signal transmission path, i.e., with FETs 64. Reference numerals 66*b* and 66*c* designate gate bias terminals of the FETs 64 and 65. An SPDT switch 67 with wide band characteristics is constituted by these FETs 64 and 65. The terminal 51 of FIG. 6 is employed as the input terminal A of the 3 dB directional coupler 19 of FIG. 3, the terminal 52 of FIG. 6 as the output terminal C of FIG. 3, the terminal 66*b* of FIG. 6 as the terminal 5*b* of FIG. 3, and the terminal 66*c* of FIG. 6 as the terminal 5*c* of FIG. 3.

Figure 12:
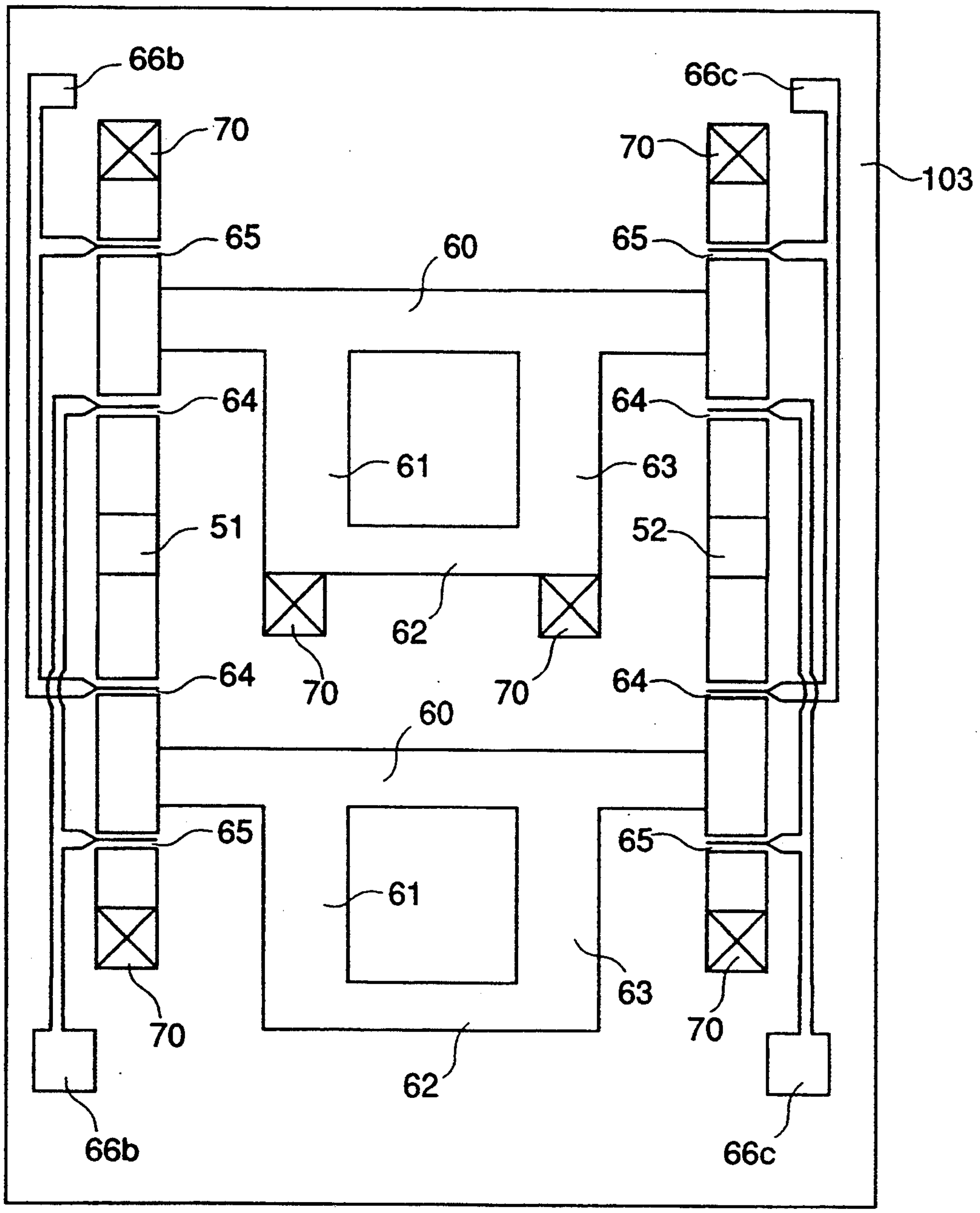
FIG. 12 is a diagram illustrating a circuit pattern of a 180° reflector type phase shifter using a branch line type 3 dB directional coupler of a 90° phase shifter according to a third embodiment of the present invention.

FIG. 12 shows a pattern layout of the reflector type phase shifter of FIG. 6 as the third embodiment of the present invention. In FIG. 12, reference numerals are used to designate elements the same as or corresponding to those described above. Reference numeral 70 designates a ground pad and reference numeral 103 designates a substrate.

(3) Description of operation of a 90° phase shifter of this third embodiment:

The 90° phase shifter of this third embodiment has a bandwidth that is the same as that of the branch line type directional coupler as ±10% from the center frequency, where the center frequency is 300 $MH_2$ to 30 $GH_z$.

The 90° phase shifter of this embodiment employing a reflector type 180° phase shifter performs fundamentally the same operation as that of the 90° phase shifter of the first embodiment.

A vector diagram showing the operation of the 90° phase shifter of this third embodiment is the same as that of FIG. 4.

(4) Description of effects of the 90° phase shifter of the third embodiment:

By carrying out such an operation, the signal that leaks on the off side line becomes the signal in an advanced phase by 90° relative to the signal on the on side line in all cases, and further because the transmission lines 14 and 15 have electrical lengths producing a phase difference of 90°, the vector 10 and the vector 18 always have a phase difference of 90°. In addition, even if the off-capacitance ($C_T$) of the FET varies depending on the non-uniformity of production processing, if the characteristics of the FETs 3 which are located adjacent each other are the same, then the vectors 9 and 17 vary by the same amount at the same time, and the phase difference between the vector 10 and the vector 18 which are to be synthesized with each other is always kept at 90°, thereby providing a 90° phase shifter having stable operation.

EMBODIMENT 4

A 180° phase shifter that performs the same operation as that which is performed by using the above described branch line type 3 dB directional coupler can be realized by using a Lange coupler. A 90° phase shifter of this fourth embodiment of the present invention includes the 180° reflector type phase shifter 20 in the third embodiment, the equivalent circuit of which is shown in FIG. 7.

Figure 7:
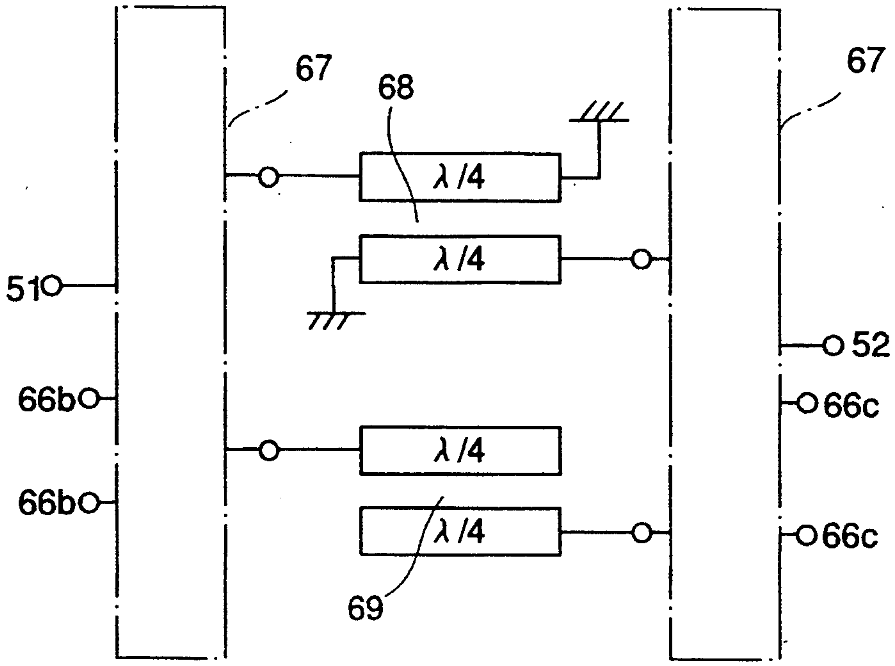
FIG. 7 is a diagram illustrating an equivalent circuit of a 180° reflector type phase shifter using a 3 dB directional coupler employing a Lange coupler in a 90° phase shifter according to a fourth embodiment of the present invention.

In FIG. 7, reference numeral 68 designates a Lange coupler which has its load terminals grounded. Reference numeral 69 designates a Lange coupler which has its load terminals open. Reference numerals 64 to 67, 51 and 52 are the same as those shown in FIG. 6. That is, reference numeral 64 designates FETs which are connected in series with the signal transmission path between the input terminal 51 and the output terminal 52. Reference numeral 65 designates FETs which are connected in parallel with the signal transmission path, i.e., the FETs 64. Reference numeral 66 designates a gate bias terminal of the FETs 64 and 65. Reference numeral 67 designates an SPDT switch having a wide band characteristics including these FETs 64 and 65. The 90° phase shifter of this embodiment using a reflector type 180° phase shifter employs the terminal 51 of FIG. 7 as the input terminal A of the 3 dB directional coupler 19 of FIG. 3, the terminal 52 of FIG. 7 as the output terminal C of FIG. 3, the terminal 66*b* of FIG. 7 as the terminal 5b of FIG. 3, and the terminal 66c of FIG. 7 as the terminal 5c of FIG. 3.

Figure 13:
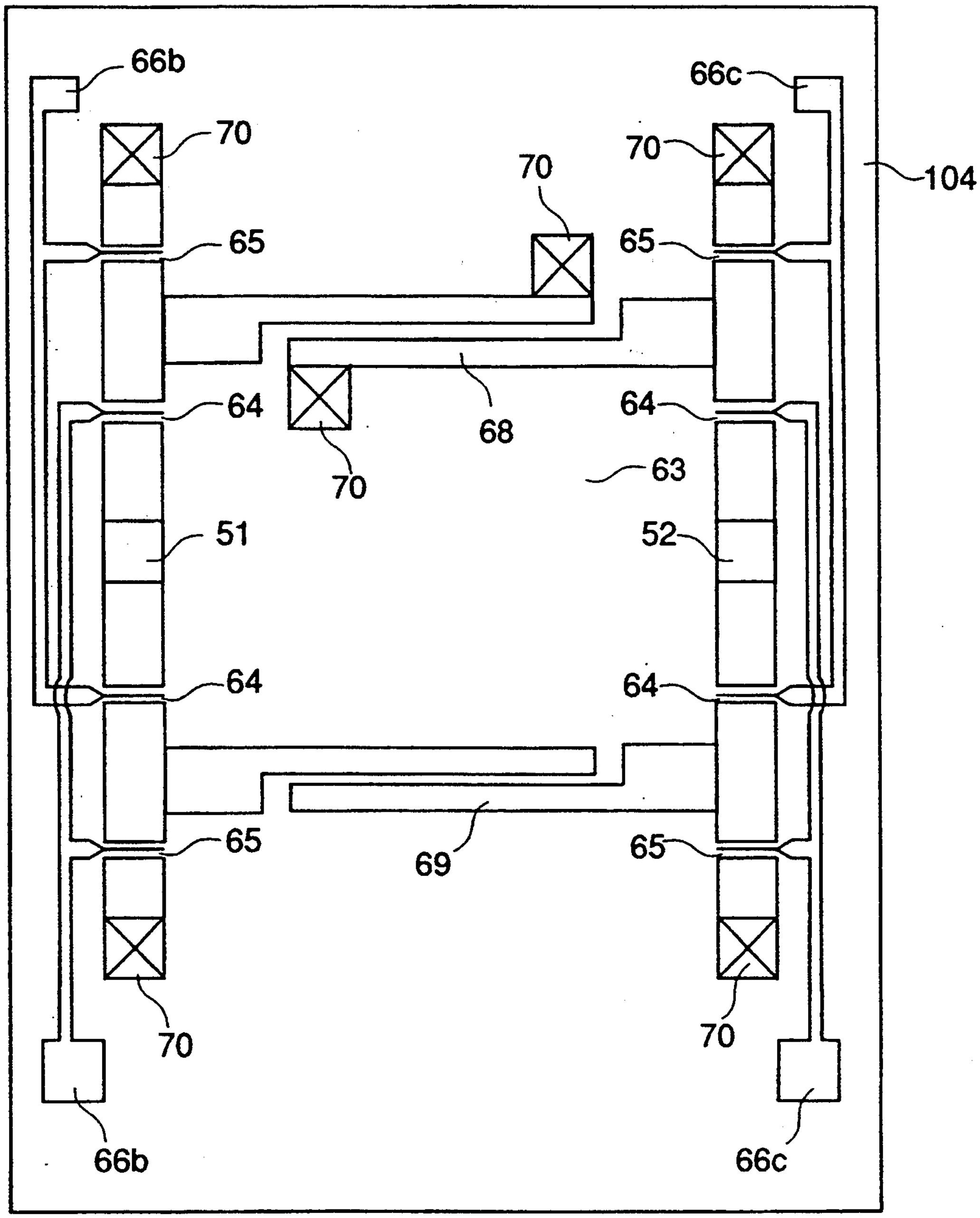
FIG. 13 is a diagram illustrating a circuit pattern of a 180° reflector type phase shifter using a Lange coupler of a 90° phase shifter according to a fourth embodiment of the present invention.

FIG. 13 shows a circuit pattern layout of a 180° reflector type phase shifter of this fourth embodiment. In the figure, the same reference numerals are used to designate elements the same as or corresponding to the those described above, and reference numeral 104 designates a substrate.

The 90° phase shifter of this fourth embodiment using the reflector type 180° phase shifter of FIG. 7, for which circuit pattern is shown in FIG. 13, performs the same way as that of the 90° phase shifter of the above described second and third embodiments. Here, the 180° reflector type phase shifter of FIG. 7 has a wide band characteristic which is operable for ±50% of the center frequency because the band of the Lange coupler amounts to about ±50% of the center frequency, where the center frequency is 300 $MH_z$ to 30 $GH_z$.

As is evident from the foregoing description, according to the present invention, a switched line type 90° phase shifter has as the difference in electrical lengths between a reference line and a phase difference producing line of 90° and a phase inverting circuit is added to the reference line switchable between a state where it is connected in series between two parts of the reference line and a state where it is not connected the two parts of the reference line. Leakage signals flowing on the reference line and on the phase difference producing line when the resonance circuit is in an off-state are reliably in a 90° advanced phase relative to the signal on the on side line, whereby the phase shift due to the leakage signal is the same as in cases where the leakage signal is generated in either of the lines, whereby the influences by the leakage signals are canceled in the operation of the phase shifter. Therefore, since the leakage signal of the FET located adjacent each other are the same, there is no necessity to know in advanced the amplitude of the leakage signal or to consider the magnitude of the leakage signal in advance of designing the phase shifter, and the circuit design can be performed quite easily and with high precision. Further, non-uniformities depending on the production processes can be tolerated and a high yield can be achieved.

What is claimed is:

1. A 90° phase shifter comprising:

first and second single pole double throw (SPDT) switches, the first SPDT switch receiving an input signal input to an input terminal of said first SPDT switch and outputting the signal to one of first and second output terminals of said first SPDT switch, and the second SPDT switch receiving the signals from said first SPDT switch at one of first and second input terminals of said second SPDT switch and outputting the signal at an output terminal of said second SPDT switch;

a reference transmission line having an electrical length of $\alpha$ connected between said first output terminal and said first input terminal of said first and second SPDT switches, respectively, said reference transmission line being divided into two parts of substantially equal electrical lengths of $\alpha/2$;

a phase difference producing transmission line having an electrical length of $(90°+\alpha)$ at a usage frequency connected between said second output terminal and said second input terminal of said first and said second SPDT switches, respectively; and a phase inverting circuit connected to and between the two parts of said reference transmission line and including a phase shift selection switch for switching said phase inverting circuit between connection to the two parts of said reference transmission line and disconnection from the two parts of said reference transmission line, said input terminal of said first SPDT switch being an input terminal of said phase shifter and said output terminal of said second SPDT switch being an output terminal of said phase shifter.

2. The 90° phase shifter of claim 1, wherein said phase selection switch comprises an FET and a resonant line connected in parallel and to the parts of said reference transmission line; and said phase inverting circuit includes a half-wavelength line having an electrical length of 180° at the usage frequency connected in parallel with said phase selection switch.

3. The 90° phase shifter of claim 1, wherein said phase inverting circuit comprises a reflector type 180° phase shifter.

4. The 90° phase shifter of claim 3, wherein said reflector type 180° phase shifter comprises a 3 dB directional Lange coupler.

5. The 90° phase shifter of claim 3, wherein said reflector type phase shifter comprises a 3 dB directional branch line coupler.

* * * * *